(12) United States Patent
Guzek

(10) Patent No.: US 8,742,561 B2
(45) Date of Patent: Jun. 3, 2014

(54) RECESSED AND EMBEDDED DIE CORELESS PACKAGE

(75) Inventor: John Guzek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 162 days.

(21) Appl. No.: 12/655,321

(22) Filed: Dec. 29, 2009

(65) Prior Publication Data

US 2011/0156231 A1 Jun. 30, 2011

(51) Int. Cl.
*H01L 23/02* (2006.01)

(52) U.S. Cl.
USPC .............. 257/685; 257/687; 257/E23.085; 257/E21.499

(58) Field of Classification Search
USPC .............. 257/686, E23.085, E21.499, 687
See application file for complete search history.

(56) References Cited

U.S. PATENT DOCUMENTS

| | | | |
|---|---|---|---|
| 5,353,498 A | 10/1994 | Fillion et al. |
| 5,497,033 A | 3/1996 | Fillion et al. |
| 5,527,741 A | 6/1996 | Cole et al. |
| 5,841,193 A | 11/1998 | Eichelberger |
| 6,154,366 A | 11/2000 | Ma et al. |
| 6,159,767 A | 12/2000 | Eichelberger |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,489,185 B1 | 12/2002 | Towle et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |

(Continued)

FOREIGN PATENT DOCUMENTS

| | | |
|---|---|---|
| JP | 2005209689 A | 8/2005 |
| JP | 2006032379 A | 2/2006 |

(Continued)

OTHER PUBLICATIONS

Skeete et al., "Integrated Circuit Packages Including High Destinty Bump-Less Build Up Layers and a Lesser Density Core or Coreless Substrate" U.S. Appl. No. 11/860,922, filed Sep. 25, 2007, 19 pages.

(Continued)

*Primary Examiner* — Timor Karimy
(74) *Attorney, Agent, or Firm* — Winkle, PLLC

(57) ABSTRACT

Methods of forming a microelectronic packaging structure and associated structures formed thereby are described. Those methods may include forming a cavity in a plating material to hold a die, attaching the die in the cavity, forming a dielectric material adjacent the die, forming vias in the dielectric material adjacent the die, forming PoP lands in the vias, forming interconnects in the vias, and then removing the plating material to expose the PoP lands and die, wherein the die is disposed above the PoP lands.

12 Claims, 7 Drawing Sheets

(56) References Cited

U.S. PATENT DOCUMENTS

| | | | |
|---|---|---|---|
| 6,706,553 | B2 | 3/2004 | Towle et al. |
| 6,709,898 | B1 | 3/2004 | Ma et al. |
| 6,713,859 | B1 | 3/2004 | Ma |
| 6,734,534 | B1 | 5/2004 | Vu et al. |
| 6,794,223 | B2 | 9/2004 | Ma et al. |
| 6,818,544 | B2 | 11/2004 | Eichelberger et al. |
| 6,825,063 | B2 | 11/2004 | Vu et al. |
| 6,841,413 | B2 | 1/2005 | Liu et al. |
| 6,888,240 | B2 | 5/2005 | Towle et al. |
| 6,894,399 | B2 | 5/2005 | Vu et al. |
| 6,902,950 | B2 | 6/2005 | Ma et al. |
| 6,964,889 | B2 | 11/2005 | Ma et al. |
| 7,067,356 | B2 | 6/2006 | Towle et al. |
| 7,071,024 | B2 | 7/2006 | Towle et al. |
| 7,078,788 | B2 | 7/2006 | Vu et al. |
| 7,109,055 | B2 | 9/2006 | McDonald et al. |
| 7,112,467 | B2 | 9/2006 | Eichelberger et al. |
| 7,160,755 | B2 | 1/2007 | Lo et al. |
| 7,183,658 | B2 | 2/2007 | Towle et al. |
| 7,189,596 | B1 | 3/2007 | Mu et al. |
| 7,416,918 | B2 | 8/2008 | Ma |
| 7,420,273 | B2 | 9/2008 | Liu et al. |
| 7,425,464 | B2 | 9/2008 | Fay et al. |
| 7,442,581 | B2 | 10/2008 | Lytle et al. |
| 7,476,563 | B2 | 1/2009 | Mangrum et al. |
| 7,588,951 | B2 | 9/2009 | Mangrum et al. |
| 7,595,226 | B2 | 9/2009 | Lytle et al. |
| 7,605,459 | B2 | 10/2009 | Mok et al. |
| 7,619,901 | B2 | 11/2009 | Eichelberger et al. |
| 7,632,715 | B2 | 12/2009 | Hess et al. |
| 7,648,858 | B2 | 1/2010 | Tang et al. |
| 7,651,889 | B2 | 1/2010 | Tang et al. |
| 7,655,502 | B2 | 2/2010 | Mangrum et al. |
| 7,659,143 | B2 | 2/2010 | Tang et al. |
| 7,723,164 | B2 | 5/2010 | Lu et al. |
| 2007/0132072 | A1 | 6/2007 | Chang |
| 2007/0155057 | A1 | 7/2007 | Wang |
| 2007/0289127 | A1* | 12/2007 | Hurwitz et al. ............... 29/827 |
| 2008/0054448 | A1 | 3/2008 | Lu et al. |
| 2008/0192776 | A1 | 8/2008 | Fleming et al. |
| 2008/0315377 | A1 | 12/2008 | Eichelberger et al. |
| 2008/0315391 | A1 | 12/2008 | Kohl et al. |
| 2009/0007282 | A1 | 1/2009 | Tomizuka et al. |
| 2009/0072382 | A1 | 3/2009 | Guzek |
| 2009/0079063 | A1 | 3/2009 | Chrysler et al. |
| 2009/0079064 | A1 | 3/2009 | Tang et al. |
| 2009/0212416 | A1 | 8/2009 | Skeete |
| 2009/0236750 | A1 | 9/2009 | Chia |
| 2009/0246909 | A1* | 10/2009 | Takeuchi et al. ............. 438/106 |
| 2009/0294942 | A1 | 12/2009 | Palmer et al. |
| 2010/0044855 | A1 | 2/2010 | Eichelberger et al. |
| 2010/0047970 | A1 | 2/2010 | Eichelberger et al. |
| 2011/0024899 | A1* | 2/2011 | Masumoto et al. ........... 257/737 |
| 2011/0156231 | A1 | 6/2011 | Guzek |
| 2012/0074580 | A1 | 3/2012 | Nalla et al. |
| 2012/0074581 | A1 | 3/2012 | Guzek et al. |
| 2012/0112336 | A1 | 5/2012 | Guzek et al. |
| 2012/0139095 | A1 | 6/2012 | Manusharow et al. |
| 2012/0139116 | A1 | 6/2012 | Manusharow et al. |

FOREIGN PATENT DOCUMENTS

| | | | |
|---|---|---|---|
| JP | 2009-105393 | A | 5/2009 |
| WO | 2009/001564 | A | 12/2008 |
| WO | 2011/090568 | A2 | 7/2011 |
| WO | 2011/090568 | A3 | 10/2011 |

OTHER PUBLICATIONS

Nalla et al.,; "Microelectronic Package and Method of Manufacturing Same", U.S. Appl. No. 12/590,350, filed Nov. 6, 2009, 20 pages.

Guzek et al.; "Semiconductor Package with Embedded Die and Its Methods of Fabrication", U.S. Appl. No. 12/655,335, filed Dec. 29, 2009, 36 pages.

Nalla et al.; "Forming Functionalization Carrier Structures with Coreless Packages", U.S. Appl. No. 12/761,782, filed Apr. 16, 2010, 36 pages.

Nalla et al.; "Microelectronic Package and Method of Manufacturing Same", U.S. Appl. No. 12/825,729, filed Sep. 29, 2009, 26 pages.

Guzek; "Mold Compounds in Improved Embedded-Die Coreless Substrates, and Processes of Forming Same", U.S. Appl. No. 12/821,847, filed Jun. 23, 2010, 36 pages.

Nalla et al.; "Forming In-Situ Micro-Feature Structures with Coreless Packages", U.S. Appl. No. 12/755,183, filed Apr. 6, 2010, 21 pages.

Nalla et al.; "Forming Metal Filled Die Back-Side Film for Electromagnetic Interference Shielding with Coreless Packages", U.S. Appl. No. 12/755,201, filed Apr. 6, 2010, 23 pages.

Guzek et al.; "System-In-Package Using Embedded-Die Coreless Substrates, and Processes of Forming Same", U.S. Appl. No. 12/725,925, filed Mar. 17, 2010, 34 pages.

Sankman et al.; "Embedded Semiconductive Chips in Reconstituted Wafers, and Systems Containing Same", U.S. Appl. No. 12/753,637, filed on Apr. 2, 2010, 34 pages.

Swaminathan et al.; "Magnetic Microelectronic Device Attachment", U.S. Appl. No. 12/778,335, filed on May 12, 2010, 43 pages.

Malatkar; "Bumpless Build-Up Layer Package Design with an Interposer", U.S. Appl. No. 12/827,323, filed on Jun. 30, 2010, 28 pages.

Crawford et al.; "Misalignment Correction for Embedded Microelectronic Die Applications", U.S. Appl. No. 12/830,875, filed on Jul. 6, 2010, 41 pages.

Ma et al.; "Direct Build-Up Layer on an Encapsulated Die Package", U.S. Appl. No. 09/640,961, filed on Aug. 16, 2000, 70 pages.

International Search Report and Written Opinion received for PCT Patent Application No. PCT/US2010/059197, mailed on Aug. 10, 2011, 11 pages.

International Preliminary Report on Patentability Received for PCT Patent Application No. PCT/US2010/059197, Mailed on Jul. 12, 2012, 8 pages.

Office Action Received for German Patent Application No. 112010005038.4, Mailed on Apr. 4, 2013, 82 pages of office action only.

Office Action received for Japanese Patent Application No. 2012-544605, mailed on Aug. 6, 2013, 7 pages of Office Action Including 4 page of English Translation.

Office Action received for Korean Patent Application No. 2012-7016870, mailed on Aug. 22, 2013, 4 pages of English Translation.

Office Action received for GB Patent Application No. GB 1208344.0, mailed on Sep. 9, 2013, 4 pages.

Office Action received for United Kingdom Patent Application No. 1208344.0, mailed on Dec. 20, 2013, 2 pages.

* cited by examiner

RECESSED AND EMBEDDED DIE CORELESS PACKAGE

BACKGROUND OF THE INVENTION

As semiconductor technology advances for higher processor performance, advances in packaging architectures may include package-on-package (PoP) architecture and other such assemblies. As the design of package structures becomes more complex, there is often a resulting increase in assembly expense. Thus there is a need to significantly lower package and assembly costs for advanced package structures.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
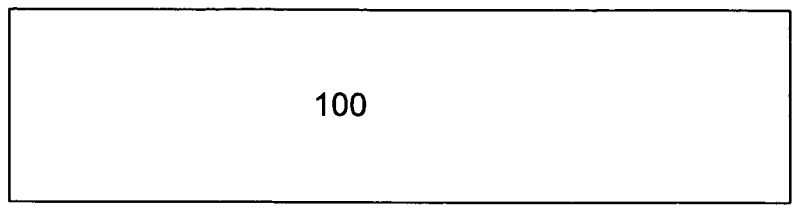
FIGS. 1a-1m represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may comprise forming a cavity in a plating material to hold a die, attaching the die in the cavity, forming a dielectric material adjacent to the die, forming vias in the dielectric material adjacent the die, forming PoP lands in the vias, forming interconnects in the vias, and then removing the plating material to expose the PoP lands and die. Methods of the present invention enable the fabrication of package-on-package architectures such as PoP assemblies comprising partially recessed and/or fully embedded die or any other type of ball grid array (BGA) package.

Figure 1B:
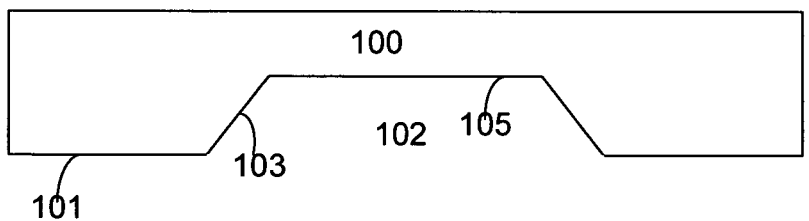

FIGS. 1a-1m illustrate embodiments of a method of forming a microelectronic structure, such as a package structure, for example. FIG. 1a illustrates a material 100. In one embodiment, the material 100 may comprise a plating material, such as but not limited to a copper foil plating material, for example. In some embodiments, any suitable plating material may be utilized, depending upon the particular application. In FIG. 1b, a cavity 102 may be formed in the material 100. The cavity 102 may be formed utilizing any suitable etching process in some embodiments, such as are known in the art. In an embodiment, the cavity 102 may be formed such that the cavity 102 may hold a die, such as a microelectronic die, for example. The cavity 102 may comprise a bottom portion 101 an angled portion 103, and a top portion 105. In an embodiment, the bottom and top portions may be separated by a barrier layer to aid in the formation of the cavity structure, especially for an etching process. In an embodiment (not shown), PoP land structures (to be described further herein) can be formed on surface 101.

Figure 1C:
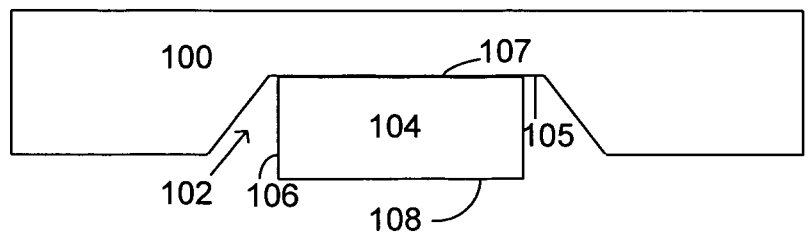

In an embodiment, a die 104 may be attached within the cavity 102 (FIG. 1c). In an embodiment, the die 104 may comprise a thin die 104, and may comprise a thickness of below about 150 microns. In an embodiment, the die 104 may be attached to the top portion 105 of the cavity 101. In an embodiment, the die 104 may comprise at least one sidewall 106, a top side 107 and a bottom/active side 108. In some cases, an adhesive film and/or an attach process may be used to attach the die 104 into the cavity 102 of the plating material 100. In an embodiment, the adhesive film (not shown), can be used as a permanent part of a final package to protect the die backside, to provide a surface for marking, and/or manage any warpage that may occur within the die 104, for example.

Figure 1D:
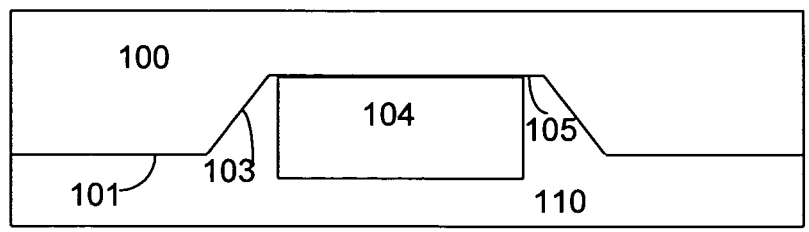
Figure 1E:
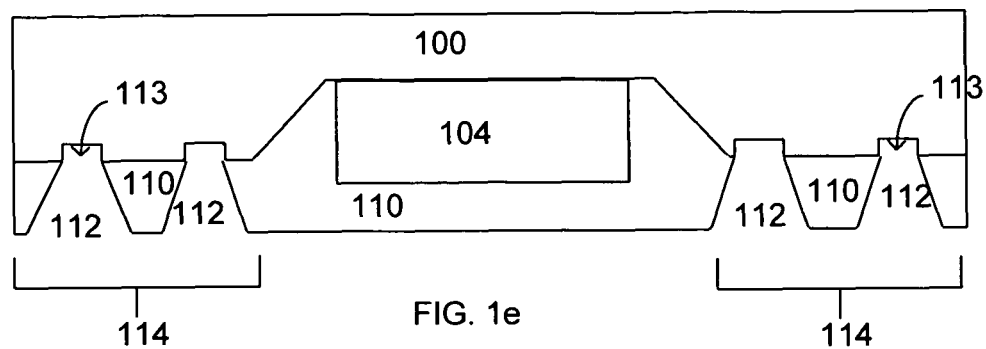

A dielectric material 110 may be formed on the plating material 100 and adjacent the die 104 that is in the cavity 102 of the plating material 100 (FIG. 1d). In an embodiment, the dielectric material 110 may be formed by a laminating process, for example. The dielectric material 110 may be formed on the bottom portion 101 of the cavity 102, on the angled portion 103 of the cavity 102, and on a portion of the top portion 105 of the cavity 102 of the plating material 100 that surrounds the die 104. Vias 112 may be formed in a region 114 of the dielectric material 110 adjacent the die 104 (FIG. 1e). In an embodiment, a package on package (PoP) land area 113 may be formed within the via 112, wherein a portion of the plating material 100 may be removed to form the PoP land area 113. In an embodiment, the plating material 100 and the dielectric material 110 may be removed using any suitable etching process.

Figure 1F:
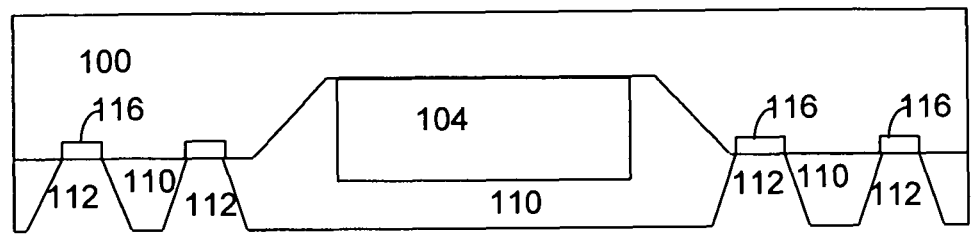

In an embodiment, a PoP land structure 116 may be formed in the PoP land area 113 (FIG. 1f). The PoP land structure 116 may be formed in the PoP land area 113 by using an electrolytic plating process, for example, however any suitable process may be utilized to form the PoP land structure 116. In an embodiment, the plating material 100 within the PoP land area 113 may be used as a plating bus for the formation of the PoP land structure 116. In an embodiment, the plating material 100 may comprise a copper foil that may be used as a plating bus. In some cases, plating metallurgies may include gold, nickel, gold/nickel, gold/nickel/palladium, and the similar suitable materials, according to the particular application. In an embodiment, wire bond pads may be plated on the PoP land area 113, allowing for a mixed-technology stacking on a CPU die backside, for example.

Figure 1G:
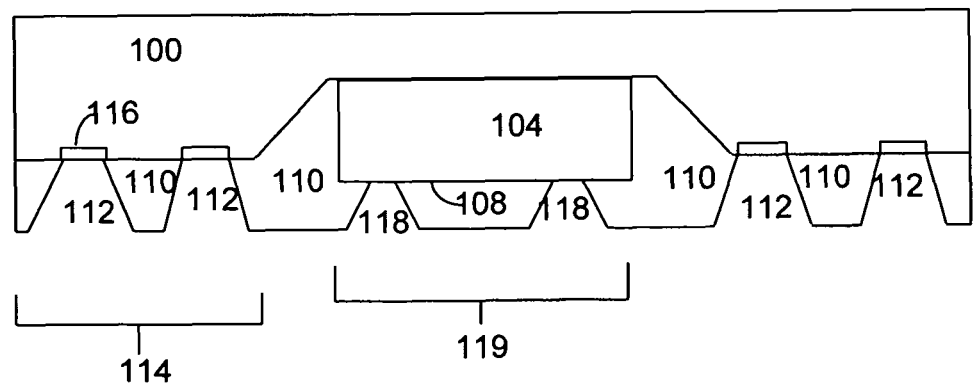
Figure 1H:
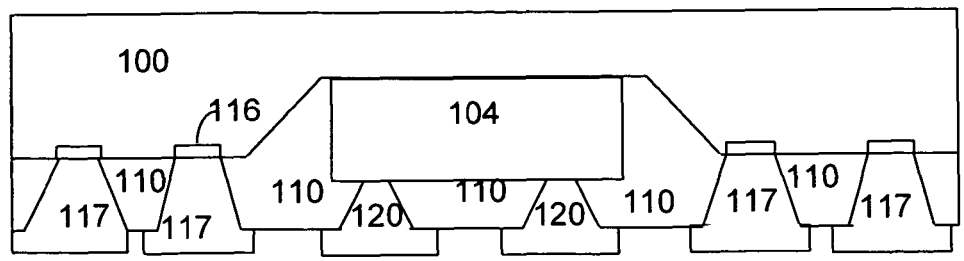

In an embodiment, vias 118 may be formed in a die area 119, wherein die pads, for example copper die pads, may be exposed on the active side 108 of the die 104 (FIG. 1g). The vias 112 adjacent the PoP land structures 116 (those located in the dielectric region 114) and the vias 118 in the die area 119 may be plated with a metallic material (FIG. 1h) to form PoP land structure 116 interconnect structures 117 and to form die pad interconnect structures 120. In an embodiment, the PoP land interconnect structure 117 may be electrically connected to the PoP land structure 116, and the die pad interconnect structure 120 may be electrically connected to die pads on the active side 108 of the die 104.

Figure 1I:
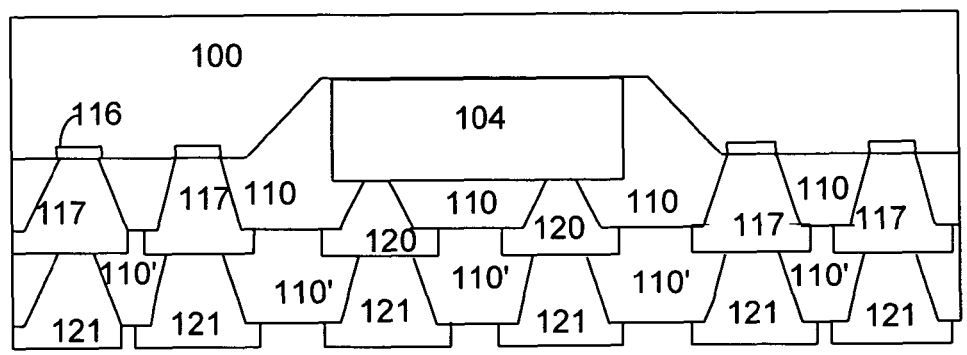

In an embodiment, a semi-additive process (SAP) may be used to form the die pad interconnect structures 120 and the PoP interconnect structures 118. In some embodiments, the die pad interconnect structures 120 and the PoP interconnect structures 118 may be formed in the same process step, or in other embodiments, the die pad interconnect structures 120 and the PoP interconnect structures 118 may be formed in separate formation steps. A second dielectric layer 110' may be formed on the die pad interconnect structures 120 and the PoP interconnect structures 118 (FIG. 1*i*). A first metallization layer 121 may be formed in the second dielectric layer 110'.

Figure 1J:
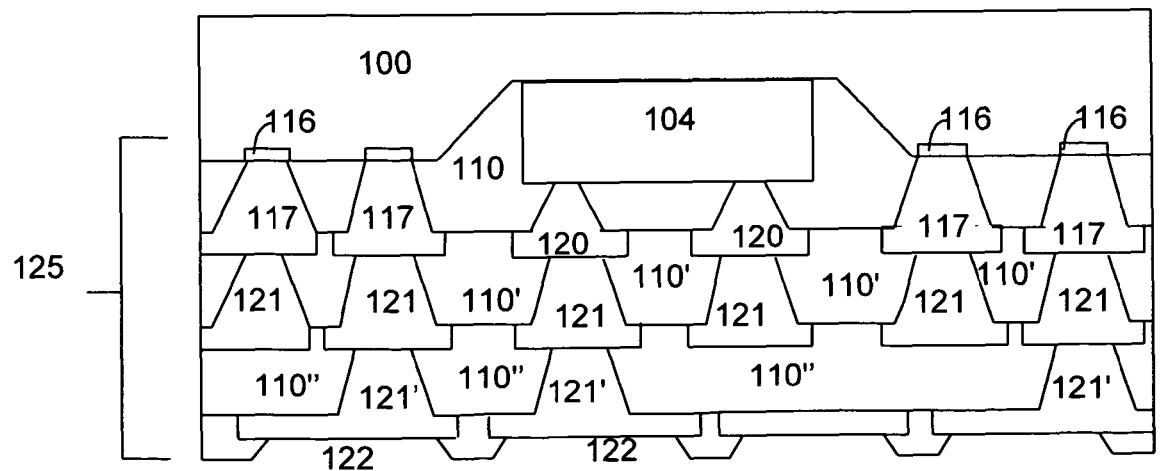
Figure 1K:
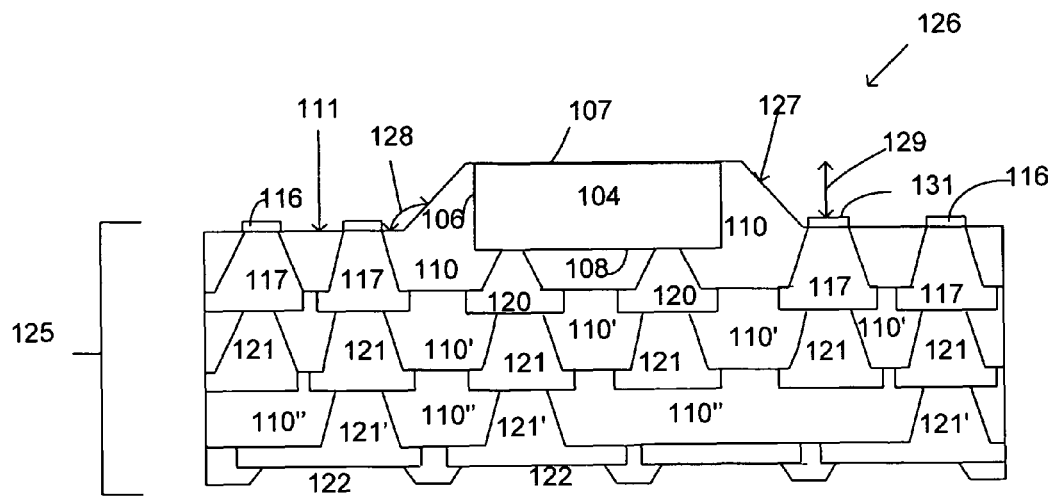

Subsequent layers may then be formed using standard substrate SAP build-up processing, for example, wherein further dielectric layers 120" and metallization layers 121' may be formed upon each other to form a coreless substrate 125 by utilizing a buildup process (FIG. 1*j*). The plating material 100 may then be removed from the die 104 and the PoP land structures 116 of the coreless substrate 125, exposing the PoP lands and the die, to form a coreless package structure 126 (FIG. 1*k*). The coreless package structure 126 may comprise a fillet structure 127 of dielectric material 110 around the die 104, wherein the dielectric material 110 may surround the sidewall 106 and the bottom 108 of the die 104, but wherein the dielectric material 110 is absent on the top side 107 of the die 104.

The fillet structure 127 may comprise a portion of the dielectric 110 that may be angled/raised in relation to a planar top portion 111 of the dielectric 110 of the coreless substrate 125. The geometry of this fillet structure 127 can be optimized to provide maximum reliability of the die/package, wherein an angle 128 of the fillet structure 127 may be varied to optimize reliability. In an embodiment, the angle of the fillet structure may comprise about 70 degrees or less, but may be varied according to the application.

In an embodiment, the coreless package structure 126 may comprise the die 104 being at least partially embedded in the coreless substrate 125. In other embodiments, the coreless package structure 126 may comprise the die 104 being substantially entirely embedded in the coreless substrate 125. In some embodiments, the top side 107 of the die 104 may be substantially coplanar with the top portion 111 of the dielectric 110. In another embodiment, there may be a distance 129 between the top side 107 of the die 104 and a top side 131 of the PoP land 116.

Figure 1L:
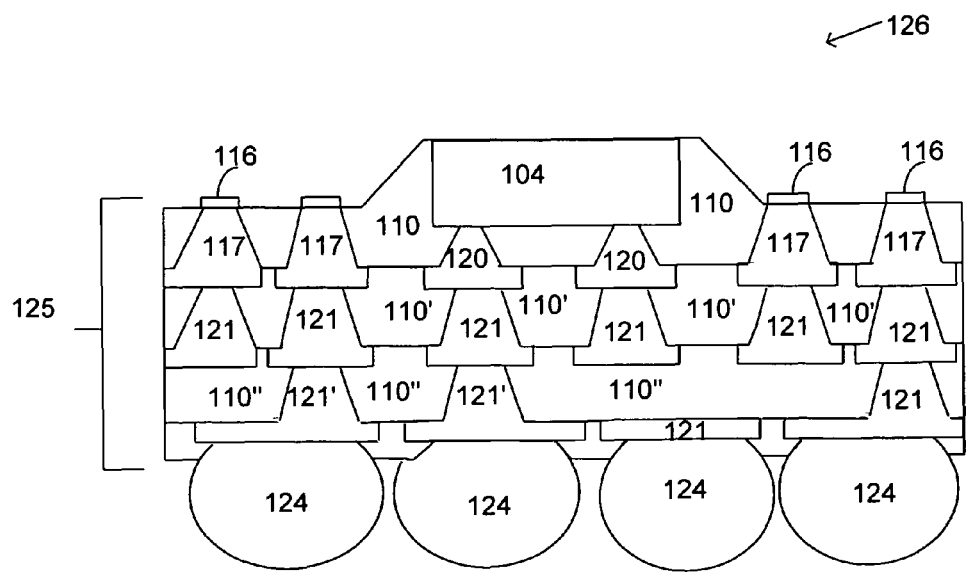

The coreless package structure 126 may comprise package interconnect structures areas 122, wherein interconnect structures 124, such as ball gird array (BGA) balls, may be attached (FIG. 1*l*). The PoP land structures 116 of the coreless package structure 126 may comprise raised, electrolytically plated lands 116 disposed on top of the coreless substrate 125, thus enabling the attachment of another package on top of the coreless package structure 126 (e.g. Package-on-Package structure).

Figure 1M:
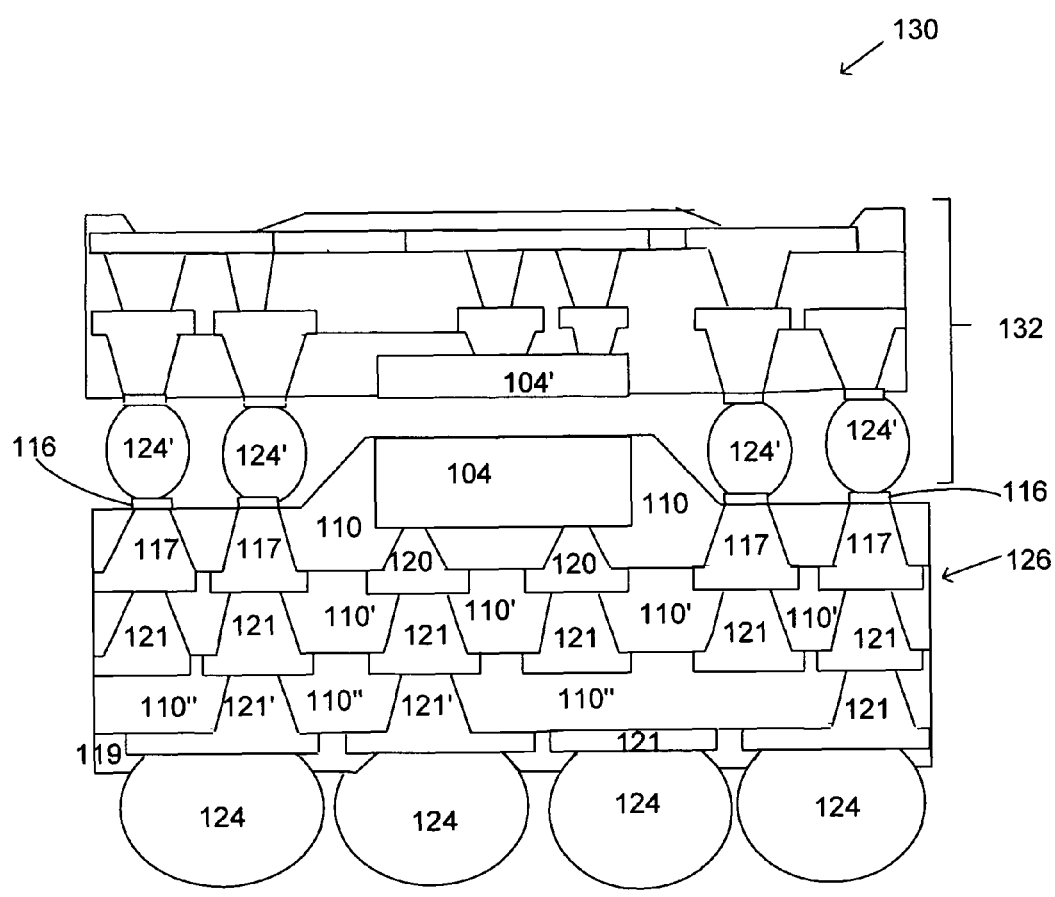

FIG. 1*m* depicts a PoP structure 130, wherein a second package 132 is connected to the coreless package structure 126 by attachment to the PoP land structures 116. In an embodiment, the second package 132 may comprise a die 104' that is directly above the die 104 of the coreless package structure 126. Interconnect balls 124' of the second package 132 may be attached to the PoP land structures 116 of the coreless package structure 126.

Figure 2:
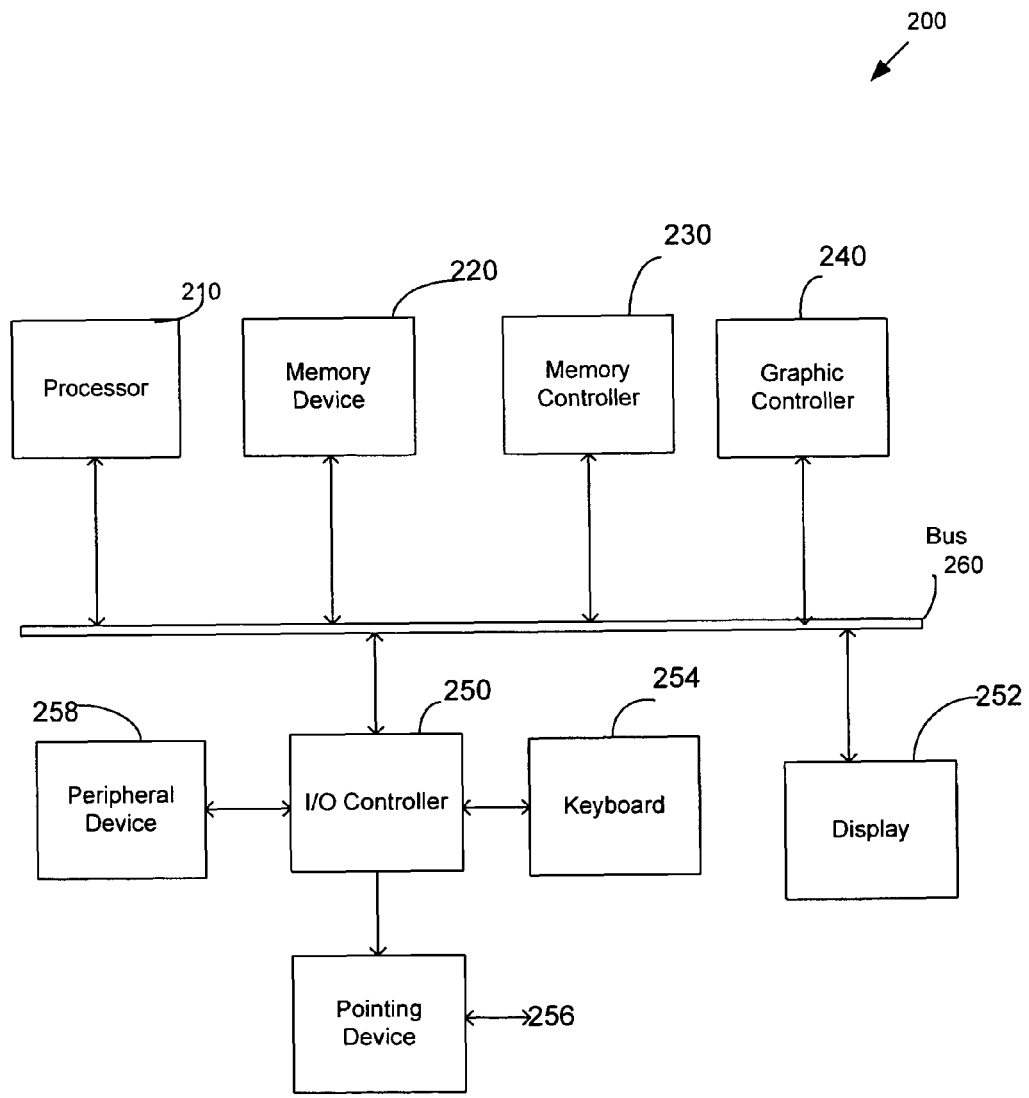
FIG. 2 represents a system according to an embodiment of the invention.

FIG. 2 is a diagram illustrating an exemplary system 200 capable of being operated with methods for fabricating a microelectronic structure, such as the coreless package structure 126 of FIG. 1*l*, for example. It will be understood that the present embodiment is but one of many possible systems in which the coreless package structures of the present invention may be used.

FIG. 2 shows a computer system according to an embodiment of the invention. System 200 includes a processor 210, a memory device 220, a memory controller 230, a graphics controller 240, an input and output (I/O) controller 250, a display 252, a keyboard 254, a pointing device 256, a peripheral device 258, and a bus 260. Processor 210 may be a general purpose processor or an application specific integrated circuit (ASIC). I/O controller 250 may include a communication module for wired or wireless communication. Memory device 220 may be a dynamic random access memory (DRAM) device, a static random access memory (SRAM) device, a flash memory device, or a combination of these memory devices. Thus, in some embodiments, memory device 220 in system 200 does not have to include a DRAM device.

One or more of the components shown in system 200 may be included in one or more integrated circuit packages, such as the coreless package structure 126 of FIG. 1*l* for example. For example, processor 210, or memory device 220, or at least a portion of I/O controller 250, or a combination of these components may be included in an integrated circuit package that includes at least one embodiment of a structure described in FIGS. 1*a*-1*m*.

System 200 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the present invention enable a new packaging architecture that can meet design requirements for future mobile/handheld system on a chip (SoC) processors at roughly half the cost of current package architectures. Embodiments provide a method of embedding a die in a substrate, which enables the elimination of many assembly processes. Embodiments enable thin die assembly, PoP compatibility, substrate design rule scalability, package thickness reduction, and package/assembly cost reduction. In addition, the substrate is no longer confined to strip manufacturing capability, which enables full panel processing, which also reduces costs.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A structure, comprising:
   a partially embedded die disposed in a coreless substrate, wherein the partially embedded die includes a top surface and a bottom/active surface;
   wherein the coreless substrate includes a dielectric material having a planar top portion and having a fillet structure that is raised in relation to the dielectric material planar top portion, wherein the fillet structure of the dielectric material has a sloped portion extending from the planar top portion to a position adjacent the partially embedded die top surface without extending onto the partially embedded die top surface, and wherein the fillet structure is adjacent to a sidewall of the partially embedded die;
   and
   raised PoP lands adjacent the partially embedded die on the dielectric material planar top portion of the coreless substrate, wherein the PoP lands are capable of receiving a second substrate.

2. The structure of claim 1 further comprising an adhesive film disposed on a top surface of the partially embedded die, and wherein the coreless substrate comprises a portion of a POP package structure.

3. The structure of claim 1 wherein the coreless substrate comprises a portion of a PoP package structure, and further wherein interconnect structures of a second package are disposed on the PoP lands of the coreless substrate.

4. The structure of claim 3 wherein a die of the second package is directly above the partially embedded die disposed in the coreless substrate.

5. The structure of claim 1 wherein there is a distance between a top side of the die and a top side of the PoP land.

6. A structure comprising:
   a die disposed in a coreless substrate, wherein at least a portion of the die is embedded in the coreless substrate and wherein the die includes a top surface and a bottom/active surface;
   wherein the coreless substrate includes a dielectric material having a planar top portion and having a fillet structure that is raised in relation to the dielectric material planar top portion, wherein the fillet structure of the dielectric material has a sloped portion extending from the planar top portion to a position adjacent the die top surface without extending onto the die top surface, and wherein the fillet structure is adjacent to a sidewall of die;
   raised PoP lands adjacent the die on the dielectric material planar top portion of the coreless substrate, wherein the PoP lands and the die are capable of receiving a second substrate;
   a dielectric film adjacent the die bottom/active surface, wherein die interconnect structures are disposed in the dielectric film and are connected to pads of the die bottom/active surface;
   PoP interconnect structures that are connected to the PoP lands; and
   a first metal layer disposed on the PoP interconnect structures and on the die interconnect structures.

7. The structure of claim 6 wherein the PoP lands comprise plated metal.

8. The structure of claim 6 wherein the coreless substrate comprises a portion of coreless package structure, wherein a second package is connected to the coreless package structure.

9. The structure of claim 8 wherein interconnect structures of the second package are connected to the PoP lands of the coreless package structure.

10. The structure of claim 6 wherein the die comprises a thickness of less than about 150 microns.

11. The structure of claim 6 further comprising a system comprising: a bus communicatively coupled to the structure; and a DRAM communicatively coupled to the bus.

12. A structure comprising:
    a die having a thickness of less than about 150 microns disposed in a coreless substrate, wherein at least a portion of the die is embedded in the coreless substrate and wherein the die includes a top surface and a bottom/active surface;
    wherein the coreless substrate includes a dielectric material having a planar top portion and having a fillet structure that is raised in relation to the dielectric material planar top portion, wherein the fillet structure of the dielectric material has a sloped portion extending from the planar top portion to a position adjacent the die top surface without extending onto the die top surface, and wherein the fillet structure is adjacent to a sidewall of the die;
    raised PoP lands comprising a plated metal adjacent the die on the dielectric material planar top portion of the coreless substrate;
    a dielectric film adjacent the die bottom/active surface, wherein die interconnect structures are disposed in the dielectric film and are connected to pads of the die bottom/active surface;
    PoP interconnect structures that are connected to the PoP lands;
    a first metal layer disposed on the PoP interconnect structures and on the die interconnect structures;
    wherein the coreless substrate comprises a portion of coreless package structure; and
    a second package connected to the coreless package structure, wherein the second package is connected to the PoP lands of the coreless package structure with PoP interconnect structure solder balls.

* * * * *